(12) United States Patent
Christensen

(10) Patent No.: US 7,738,546 B2
(45) Date of Patent: Jun. 15, 2010

(54) FEED FORWARD EQUALIZER FOR A COMMUNICATION SYSTEM

(75) Inventor: Benny Christensen, Frederikssund (DK)

(73) Assignee: Intel Corporation, Santa Clara, CA (US)

( * ) Notice: Subject to any disclaimer, the term of this patent is extended or adjusted under 35 U.S.C. 154(b) by 1272 days.

(21) Appl. No.: 10/952,192

(22) Filed: Sep. 27, 2004

(65) Prior Publication Data

US 2006/0067396 A1    Mar. 30, 2006

(51) Int. Cl.
*H03H 7/30* (2006.01)
(52) U.S. Cl. ............. 375/232; 375/229; 375/230; 375/231; 375/233; 375/234; 375/235; 375/236; 375/316
(58) Field of Classification Search .......... 375/130, 375/150, 219, 222, 229–236, 295, 316, 340, 375/343, 346, 350; 708/100, 200, 300, 301, 708/322, 323, 422; 333/24 R, 28 R, 144
See application file for complete search history.

(56) References Cited

U.S. PATENT DOCUMENTS

| | | | |
|---|---|---|---|
| 3,715,670 A | | 2/1973 | Hirsch et al. |
| 4,550,415 A | * | 10/1985 | Debus et al. ............ 375/234 |
| 4,612,585 A | * | 9/1986 | Takase et al. ............ 386/10 |
| 4,721,920 A | * | 1/1988 | Poletto et al. ........... 330/255 |
| 4,811,360 A | * | 3/1989 | Potter .................... 375/231 |
| 5,185,582 A | * | 2/1993 | Barbu ..................... 330/261 |
| 5,369,668 A | * | 11/1994 | Yamamoto ................ 375/233 |
| 5,668,832 A | * | 9/1997 | Yamamoto ................ 375/233 |
| 5,734,680 A | * | 3/1998 | Moore et al. ............. 375/263 |
| 5,930,296 A | | 7/1999 | Kot |
| 6,202,075 B1 | * | 3/2001 | Azadet ................... 708/322 |
| 6,665,337 B1 | | 12/2003 | Girardeau, Jr. et al. |
| 6,909,742 B1 | | 6/2005 | Leonosky |
| 6,934,387 B1 | | 8/2005 | Kim |
| 7,120,656 B1 | * | 10/2006 | Lam et al. ............... 708/319 |
| 7,130,366 B2 | * | 10/2006 | Phanse et al. ........... 375/350 |
| 7,272,177 B2 | * | 9/2007 | Lin et al. ............... 375/233 |
| 7,299,022 B2 | * | 11/2007 | Inoue et al. ............ 455/255 |
| 2005/0135468 A1 | * | 6/2005 | Asuri et al. ............ 375/232 |
| 2005/0249274 A1 | | 11/2005 | Larosa et al. |

(Continued)

FOREIGN PATENT DOCUMENTS

EP    0 675 608 A    10/1995

(Continued)

OTHER PUBLICATIONS

Zeki et al. "BiCMOS Current-Mode Integrators Suitable for Low-Voltage Continuous-Time Filters", IEEE Jul. 2003.*

(Continued)

*Primary Examiner*—Mohammad H Ghayour
*Assistant Examiner*—Sophia Vlahos
(74) *Attorney, Agent, or Firm*—Kacvinsky LLC

(57) ABSTRACT

A method and apparatus for a feed forward equalizer for a communication system are described. An equalizer comprising a tapped filter having multiple filter multipliers and a summing element is described. The equalizer further comprises a correlator having multiple correlator multipliers, with each correlator multiplier having a corresponding integrator, a set of shared delay elements to connect to the filter multipliers and the correlator multipliers; and an error signal generator to connect to the correlator.

37 Claims, 8 Drawing Sheets

U.S. PATENT DOCUMENTS

2006/0067396 A1    3/2006  Christensen
2006/0067542 A1*  3/2006  Christensen ................ 381/103

FOREIGN PATENT DOCUMENTS

EP         0 675 608 A2    10/1995

OTHER PUBLICATIONS

Dawson et al. "An Undersea Fiber-Optic Regenerator Using an Integral-Substrate Package and Flip-Chip Saw mounting", IEEE Nov. 1984.*

Cho et al., "Performance Evaluation of the Transversal Filter Equalizer Using ZF and LMS Algorithm", IEEE TENCON, Dec. 2, 1997, pp. 73-76, IEEE, USA.

Chung et al., "Characterization of the Regions of Convergence of CMA Adapted Blind Fractionally Spaced Equalizer", IEEE, Nov. 1, 1998, pp. 493-497, IEEE, USA.

P. Bert Schniter, "CMA-FSE Error Surface Examples", Jun. 10, 2004, pp. 1-5, Retrieved from the Internet on Jan. 26, 2006: <web.archive.org/web/20040610114507/http://www.ece.osu.edu/schniter/CMA_FSE_surf/CMA_FSE_surf.html>.

PCT International Search Report, International Application No.: PCT/US2005/033656, Date of Completion: Jan. 27, 2006, Date of Mailing: May 5, 2006, pp. 1-7.

Cho, Woong-Ki et al., "Performance Evaluation of the Transversal Filter Equalizer Using ZF and LMS Algorithm", 1997 IEEE TENCON—Speech and Image Technologies for Computing and Telecommunications, (Dec. 1997), pp. 73-76.

Chung, Wonzoo et al., "Characterization of the Regions of Convergence of CMA Adapted Blind Fractionally Spaced Equalizer", Signals, Systems & Computers; Conference Record of the Thirty-Second Asilomar Conference on Pacific Grove, CA, USA, IEEE, Dated: Nov. 1, 1998, vol. 1, pp. 493-497.

Schniter, P. B., "CMA-FSE Error Surface Examples", Retrieved from the Internet: <web.archive.org/web/20040610114507/http://www.ece.osu.edu/~schniter/CMA_FSE_surf/CMA_FSE_surf.html>, (Dated: Jun. 10, 2004), pp. 1-5.

* cited by examiner

FEED FORWARD EQUALIZER FOR A COMMUNICATION SYSTEM

BACKGROUND

Adaptive equalization techniques may be used in a data transceiver to compensate for amplitude and phase distortions introduced by a transmission channel. As data transmission rates increase to 10 Gigabits Per Second (Gbps) and beyond, the complexity and power requirements for an adaptive equalizer may increase as well. Consequently, there may be a need for improved adaptive equalization techniques in a device or network.

DETAILED DESCRIPTION

Figure 1:
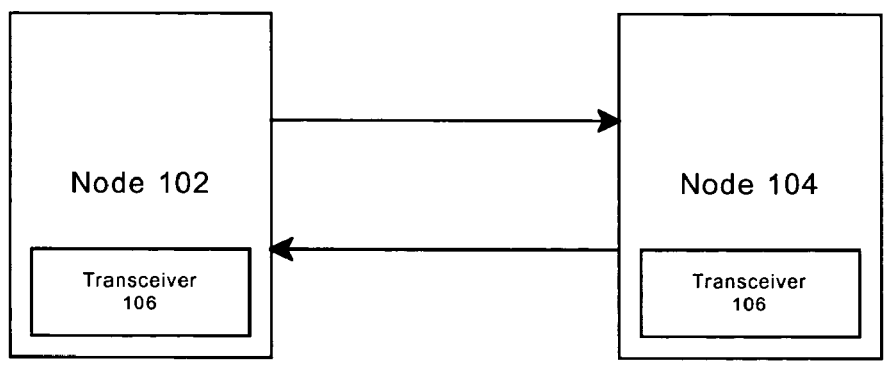
FIG. 1 illustrates a block diagram of a communication system 100.

FIG. 1 illustrates a block diagram of a system 100. System 100 may comprise, for example, a communication system having multiple nodes. A node may comprise any physical or logical entity having a unique address in system 100. Examples of a node may include, but are not necessarily limited to, a computer, server, workstation, laptop, ultra-laptop, handheld computer, telephone, cellular telephone, personal digital assistant (PDA), router, switch, bridge, hub, gateway, private branch exchange (PBX), and so forth. The unique address may comprise, for example, a network address such as an Internet Protocol (IP) address, a device address such as a Media Access Control (MAC) address, and so forth. The embodiments are not limited in this context.

The nodes of system 100 may be connected by one or more types of communications media and input/output (I/O) adapters. The communications media may comprise any media capable of carrying information signals. Examples of communications media may include printed circuit boards (PCB), back-planes, semiconductor material, twisted-pair wire, co-axial cable, fiber optics, and so forth. An information signal may refer to a signal which has been coded with information. The I/O adapters may be arranged to operate with any suitable technique for controlling information signals between nodes using a desired set of communications protocols, services or operating procedures. The I/O adapters may also include the appropriate physical connectors to connect the I/O adapters with a corresponding communications media. Examples of an I/O adapter may include a network interface, a network interface card (NIC), disc controllers, video controllers, audio controllers, and so forth. The embodiments are not limited in this context.

The nodes of system 100 may be configured to communicate different types of information, such as media information and control information. Media information may refer to any digital (binary) data representing content meant for a user, such as voice information, video information, audio information, text information, alphanumeric symbols, graphics, images, and so forth. Control information may refer to any data representing commands, instructions or control words meant for an automated system. For example, control information may be used to route media information through a system, or instruct a node to process the media information in a predetermined manner.

The nodes of system 100 may communicate media and control information in accordance with one or more protocols. A protocol may comprise a set of predefined rules or instructions to control how the nodes communicate information between each other. The protocol may be defined by one or more protocol standards as promulgated by a standards organization, such as the Internet Engineering Task Force (IETF), International Telecommunications Union (ITU), the Institute of Electrical and Electronics Engineers (IEEE), and so forth. For example, system 100 may operate in accordance with one or more Ethernet protocols as defined by the IEEE.

Referring again to FIG. 1, system 100 may comprise nodes 102 and 104. Nodes 102 and 104 may represent any number of different communication devices as previously described. Nodes 102 and/or 104 may be arranged to communicate information over a wired communications media via an I/O adapter, such as a Gigabit Ethernet NIC. For example, nodes 102 and/or 104 may be implemented using the Intel® PRO/1000 MT Gigabit Ethernet Desktop Adapter made by Intel Corporation, although the embodiments are not limited in this context. It is worthy to note that although FIG. 1 is shown with a limited number of nodes in a certain topology, it may be appreciated that system 100 may include more or less nodes in any type of topology as desired for a given implementation. The embodiments are not limited in this context.

In one embodiment, nodes 102 and 104 may each include a data transmitter/receiver ("transceiver") 106. Transceiver 106 may communicate media and control information for its respective node. Transceiver 106 may have various elements, including one or more elements arranged to implement an adaptive equalization technique.

An adaptive equalization technique may be used by transceiver 106 to compensate for amplitude and phase distortions to a communication signal introduced by the communication channel. A channel is a time-varying channel with a typically long time constant compared to the symbol period. The channel may be viewed as quasi-static, with a relatively constant impulse response. Equalizers are also used to recover timing from the distorted signal so that the local receiver clock and the remote transmitter clock are synchronous. At start-up or after interruptions, the local receiver clock and the remote transmitter clock are asynchronous. If the timing is not recovered, the transmitted signal can be lost or additional incorrect signals can be added. If the receiver clock is slower than the transmitter clock, after a long enough period of time, one sample of the received signal will be lost. On the other hand, if the local receiver clock is faster than the remote transmitter clock, after a long enough period of time, an extra sample of the receiver signal will be obtained. Equalizers have been implemented to recover received timing and data in many communication systems.

Further, the equalizers may have to be adaptive to compensate continuously for time-varying characteristics of the channel. A data transceiver often uses an adaptive algorithm to correct errors that occur in subsequent information bits. The adaptive algorithm is generally implemented by adaptive filters in the data transceiver.

In one embodiment, for example, transceiver 106 may include an adaptive filter or equalizer, such as a feed-forward filter (FFF) or feed-forward equalizer (FFE) (collectively referred to hereinafter as an "FFE"). More particularly, the adaptive equalizer may comprise a least mean square (LMS) adaptive tapped delay-line FFE. An FFE may be utilized in the front-end of the receiver path for a communication system arranged to use, for example, a non-return to zero (NRZ) binary modulation format, typically at operating speeds of approximately 10 Gbps or higher. The FFE may operate using the electrical baseband frequency spectrum covering direct current (DC) to approximately 10 Gigahertz (GHz), for example. Transceiver 106 in general, and a FFE suitable for use with transceiver 106 in particular, may be described in more detail with reference to FIGS. 2 and 3.

Figure 2:
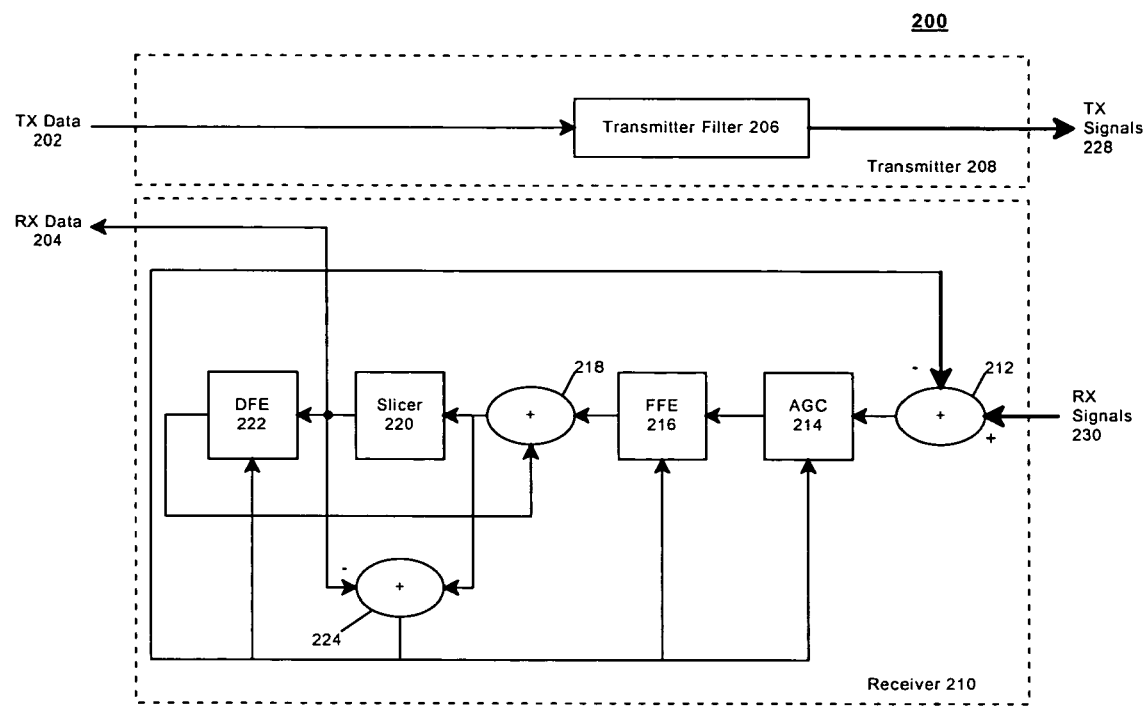
FIG. 2 illustrates a block diagram of a transceiver 200.

FIG. 2 illustrates a partial block diagram of a transceiver 200. Transceiver 200 may be representative of, for example, transceiver 106 of nodes 102 and/or 104 as described with reference to FIG. 1. As shown in FIG. 2, transceiver 200 may comprise multiple elements, such as transmitter 208 having a transmitter filter 206, and a receiver 210 having an automatic gain controller (AGC) 214, FFE 216, a slicer 220, a decision feedback equalizer (DFE) 222, and an error signal generator (ESG) 224. Some elements may be implemented using, for example, one or more circuits, components, registers, processors, software subroutines, or any combination thereof. Although FIG. 2 shows a limited number of elements, it can be appreciated that more or less elements may be used in transceiver 200 as desired for a given implementation. The embodiments are not limited in this context.

In one embodiment, transceiver 200 may communicate media and control information for nodes 102 and/or 104. On the transmit path, transmitter 208 may be arranged to receive as input media and/or control information in the form of transmit (TX) Data 202, and output TX signals 228. Transmitter 208 may include, among other elements, transmitter filter 206 to shape the transmit signal spectrum. Although TX signals 228 may include digital binary signal symbols (e.g., 0 and 1), the transmit signals are typically treated as time continuous analog signals throughout the transmission channel. Consequently, some embodiments may not use digital-to-analog (D/A) and analog-to-digital (A/D) converters, although the embodiments are not necessarily limited in this context. TX signals 228 may be sent over the communication channel to a receiver.

On the receive path, receiver 210 may be arranged to receive one or more receive (RX) signals 230. RX signals 230 typically include distortions generated during communication over the communication channel. The distortion is generally characterized by pre-samples distortion and a post-samples distortion. Receiver 210 may use adaptive equalization techniques to recover received timing of the data transceiver and recover RX signals 230 by removing the pre-sample and post-sample distortions from RX signals 230. Receiver 210 may accomplish this using multiple adaptive filters, such as AGC 214, FFE 216, and DFE 222, for example.

It is worthy to note that although transmitter 208 and receiver 210 are described together as a single transceiver 200, it may be appreciated that transmitter 208 and receiver 210 are not necessarily implemented at the same device. For example, transmitter 208 may be implemented as part of node 102 to transmit TX signals 228 to node 104 over a wired communications medium. In this case, receiver 210 may be implemented as part of node 104 to receive RX signals 230 from the wired communications medium. The embodiments are not limited in this context.

In general operation, receiver 210 may receive RX signals 230. RX signals 230 may be sent to AGC 214. AGC 214 may optimize the received signal level, and send the optimized signals to FFE 216. FFE 216 may receive the optimized signals from AGC 214, and attempt to reduce pre-sample and/or post-sample distortions. DFE 222 may remove post-sample distortions, for example. Slicer 220 may recover the received signals RX Data 204 from FFE 216 and DFE 222. A feedback loop from DFE 222 includes a common summation element 218. Error signals may be generated from the input and output of slicer 220 by ESG 224. The error signals may be generated to adapt one or more of the adaptive filters, such as AGC 214, FFE 216, and DFE 222.

In one embodiment, transceiver 200 may include FFE 216. FFE 216 may comprise a LMS adaptive tapped delay-line FFE. In an LMS based adaptive equalizer, the error signal may need to be correlated with the input data signal in a timely and coherent manner. Conventional LMS based adaptive equalizers may attempt to accomplish this by splitting the FFE into two separate blocks, with a first block to perform filtering operations and the second block to perform correlation operations. Each block may have separate sets of multipliers and delay elements. The separation of the FFE may be due to the problem of non-zero signal propagation delays in the individual cells and blocks of the physical implementations of the circuits. Splitting the filtering circuit and correlation circuit into separate blocks, however, may increase the size and power consumption of the FFE. In addition, the separate blocks may need additional complex circuitry to maintain proper delay matching and timing of the correlator signals.

One embodiment attempts to solve these and other problems using FFE 216. FFE 216 may operate as a linear time-continuous analog delay-line filter. In one embodiment, for example, FFE 216 may comprise a correlator and a tapped filter. The tapped filter may have multiple filter multipliers, and the correlator may have multiple correlator multipliers. The correlator and tapped filter may share a set of delay elements. The shared delay elements may connect to the filter multipliers and the correlator multipliers. Each delay element may include multiple delay stages, with a first delay stage to receive an input data signal and output a first delay signal to one of the correlator multiplier, and a second delay stage to receive the first delay signal and output a second delay signal to one of the filter multipliers. As a result, the correlator and tapped filter may be merged from two blocks into a single integrated block. Consequently, the size of FFE 216 may be reduced approximately 40%, and power requirements may be reduced by approximately 50%, as compared to conventional FFE using discrete two-block implementations. FFE 216 may be described in more detail with reference to FIG. 3.

Figure 3:
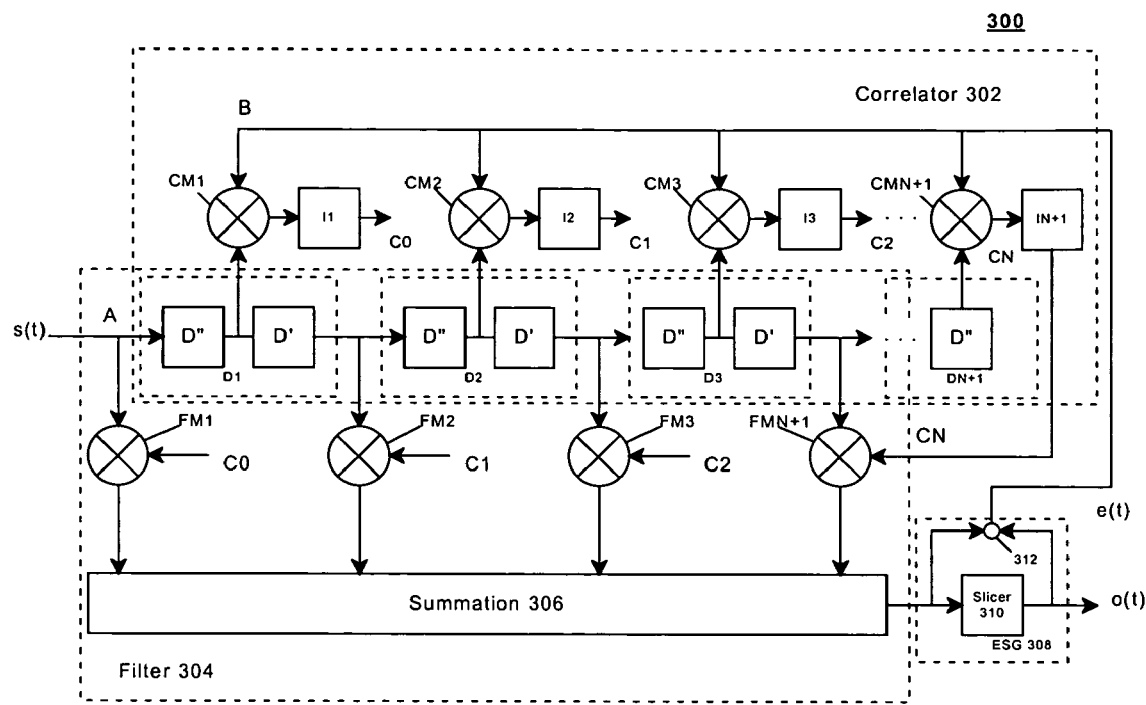
FIG. 3 illustrates a block diagram of a feed-forward equalizer 300.

FIG. 3 illustrates a block diagram of a FFE 300. FFE 300 may be representative of, for example, FFE 216 of transceiver 200 as described with reference to FIG. 2. As shown in FIG. 3, FFE 300 may comprise a correlator 302, a filter 304, and an ESG 308. FFE 300 may integrate correlator 302 and filter 304 into a single integrated block. FFE 300 may also reduce or eliminate the need for additional circuit elements to maintain delay matching and timing of the correlator signals. Although FIG. 3 shows a limited number of elements, it can be appreciated that more or less elements may be used in FFE 300 as desired for a given implementation. The embodiments are not limited in this context.

In one embodiment, FFE 300 may include filter 304. Filter 304 may comprise, for example, an N+1 tapped delay-line filter. Filter 304 may include N+1 analog high-speed filter multipliers (FM) 1–N+1 (FM1-FMN+1). Filter 304 may also include a summing element such as summation 306.

In one embodiment, FFE 300 may include ESG 308. ESG 308 may be representative of ESG 224, or alternatively, may comprise a separate ESG for FFE 300. For an analog FFE such as FFE 300, ESG 308 can be implemented using a limiter/slicer 310 and a subtraction node 312. Slicer 310 may receive a linear input signal from summation 306. The linear input signal may comprise the unlimited and unclipped output signal from summation 306. Slicer 310 may output a limited/sliced signal. Subtraction node 312 may subtract the limited/sliced signal from the linear input signal to form error signal e(t).

In one embodiment, FFE 300 may include correlator 302. Correlator 302 may correlate an error signal e(t) from ESG 308 with an input data signal s(t) for FFE 300. Correlator 302 may comprise, for example, N+1 analog high-speed correlator multipliers (CM) 1–N+1 (CM1-CMN+1). In one embodiment, the number of filter multipliers should match the number of correlator multipliers, although the embodiments are not limited in this context. Correlator 302 may also include integrators (I) 1–N+1 (INT1-INTN+1). Integrators INT1-INTN+1 may integrate the individual outputs of the correlator multipliers. The integration may be used to control the coefficient settings for filter 304.

In one embodiment, correlator 302 and filter 304 may share a set of delay elements (D) 1–N+1 (D1-DN+1). Each delay element may be implemented using multiple delay stages. In one embodiment, for example, delay elements D1-DN+1 may each be implemented using two delay stages, represented as D' and D". The total delay (TD) for each delay element may be the sum of the two partial delays D' and D". A first delay stage (D") may be arranged to receive an input data signal s(t) and output a first delay signal to one of correlator multipliers CM1-CMN+1. A second delay stage (D') may be arranged to receive the first delay signal and output a second delay signal to one of filter multipliers FM1-FMN+1.

In one embodiment, the amount of delay for each delay element, and partial delay stages (e.g., D' and D"), may be set for a desired implementation. For example, in two block implementations for an FFE, the matching input delay at the correlator is typically adjusted to match the delay A B, which corresponds to an amount of delay through one filter multiplier and the error signal generator. In one embodiment, for example, delay elements D1-DN+1 may each be set to provide an amount of delay suitable for CM1-CMN+1 and FM1-FMN+1. This may be accomplished by setting a first delay stage D" to output a first delay signal having an amount of delay matching the delay A B, and sending the first delay signal to a corresponding correlator multiplier from CM1-CMN+1. The second delay stage D' may be set to output a second delay signal having an amount of delay suitable for a given filter multiplier, and sending the second delay signal to a corresponding filter multiplier from FM1-FMN+1. It may be appreciated that the TD for each delay element, and the partial delays for each delay stage D' and D", may be set to any appropriate amount of delay for a given implementation. The embodiments are not limited in this context.

The second delay may be larger, equal or smaller than the first delay. It is the sum of the first delay and second delay that makes up the total delay of the unit-cell delay element. The total delay would normally be designed to be approximately T/2, where T is the bit period. So, the second delay is designed to match the difference between T/2 and the first delay. This may also be referred to as a fractionally spaced, tapped delay line filter.

In general operation, FFE 330 may receive an input data signal s(t) and output an equalized signal o(t). Correlator 302 correlates error signal e(t) from ESG 308 with input data signal s(t). Correlator 302 may receive error signal e(t) from ESG 308. Each correlator multiplier may receive as input the first delay signal from a delay stage D" and the error signal e(t) from ESG 308. Each correlator multiplier may output a correlator multiplier signal to a corresponding integrator INT1-INTN+1. INT1-INTN+1 may each integrate the correlator multiplier signals individually, and output a corresponding correlated signal. The correlated signal may be sent to its respective coefficients C0-CN within filter 304.

Filter 304 may receive input data signal s(t). Each filter multiplier may receive as input the second delay signal from a delay stage D' and a correlation signal coefficient from integrators 310 of correlator 302. Each filter multiplier may output a scaled signal. The scaled signals from each filter multiplier may be received by summation 306. Summation 306 may combine the scaled signals into a common load comprising a summation point, and output a summed filter signal or equalized signal o(t). It is the summation of the individually scaled and delayed signals that performs the actual filtering characteristics of FFE 300 by constructive and destructive interference.

Figure 4:
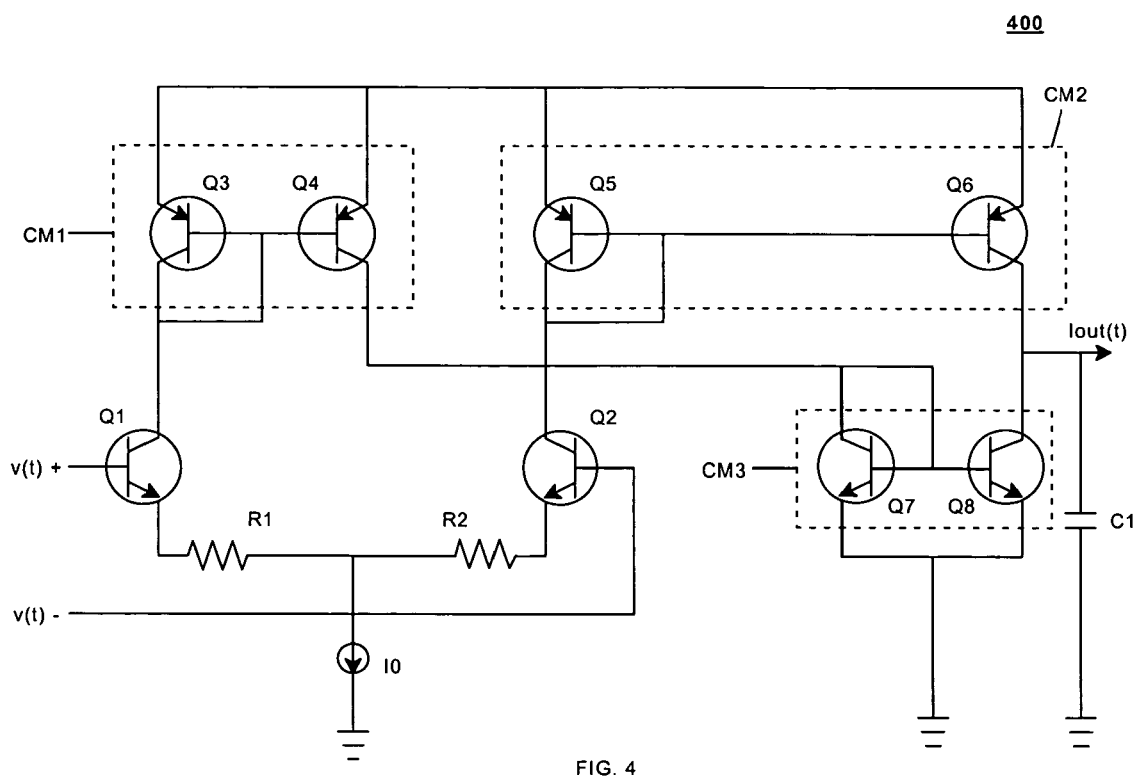
FIG. 4 illustrates a block diagram of an integrator 400.

FIG. 4 illustrates a block diagram of an integrator 400. Integrator 400 may be representative of, for example, integrators INT1-INTN+1 of FFE 300 as described with reference to FIG. 3. In one embodiment, integrator 400 may comprise a two quadrant linear current sink/source circuit. The integration of the error signal's correlation with the incoming signal may be used, for example, to control the coefficient settings of filter 304.

In one embodiment, integrator 400 may include transistors Q1-Q8. Transistors Q1-Q8 may be implemented using bipolar junction transistors (BJT) or complementary metal-oxide semiconductor (CMOS) transistors, for example. In one embodiment, for example, transistors Q1-Q8 may be implemented as NPN and/or PNP BJT transistors, although the embodiments are not limited in this context.

In one embodiment, transistors Q1 and Q2 may be arranged to form a linear stage. More particularly, transistors Q1 and Q2 may be arranged to form a linearized differential current-mode logic (CML) stage. The remaining transistors may be arranged to form three current mirrors CM1, CM2 and CM3. For example, CM1 may comprise transistors Q3 and Q4, CM2 may comprise transistors Q5 and Q6, and CM3 may comprise transistors Q7 and Q8.

In one embodiment, integrator 400 may include a linear stage comprising transistors Q1 and Q2 and negative feedback resistors R1 and R2. The base of Q1 may be coupled to a first voltage input v(t)+, the emitter of Q1 may be connected to negative feedback resistor R1, and the collector of Q1 may be connected to the collector of transistor Q3. The base of Q2 may be coupled to a second voltage input v(t)−, which is the complementary signal to v(t)+. The emitter of Q2 may be connected to negative feedback resistor R2, and the collector of Q2 may be connected to the collector of Q5. Negative feedback resistors R1 and R2 may be connected in series. The common connection of negative feedback resistors R1 and R2 may be connected to a current source I0.

In one embodiment, CM1 may comprise transistors Q3 and Q4. The collector of Q3 may be connected to the collector of Q1, and the emitter of Q3 may be connected to the emitter of Q6. The collector of Q4 may be connected to the commonly connected bases of Q7 and Q8, and the emitter of Q4 may be connected to the commonly connected emitters of Q3 and Q6. The bases of Q3 and Q4 may be connected. The commonly connected bases of Q3 and Q4 may be connected to the commonly connected collectors of Q1 and Q3.

In one embodiment, CM2 may comprise transistors Q5 and Q6. The emitter of Q5 may be connected to the commonly connected emitters of Q3, Q4 and Q6, and the collector of Q5 may be connected to the collector of Q2. The collector of Q6 may be connected to the collector of Q8. The bases of Q5 and Q6 may be connected. The commonly connected bases of Q5 and Q6 may be connected to the commonly connected collectors of Q2 and Q5.

In one embodiment, CM3 may comprise transistors Q7 and Q8. The collector of Q7 may be connected to the collector of Q4 and the commonly connected bases of Q7 and Q8. The emitters of Q7 and Q8 may be connected, and the commonly connected emitters of Q7 and Q8 may be connected to ground. The collector of Q8 may be connected to the collector of Q6. The commonly connected collectors of Q6 and Q8 may be connected to output a signal Iout(t). The integrator output may also be connected to ground via capacitor C1.

As shown in FIG. 4, the linear differential to single-ended, voltage to current source is constructed by one linearized differential CML stage and three current mirrors CM1-CM3. Current mirrors CM1-CM3 may use BJT or CMOS transistors. An integer scaling factor can be applied by using more transistors in one of the two branches of each of current mirrors CM1-CM3. The linear stage with the emitter degradation negative feedback resistors R1 and R2, may be designed to have a more linear transfer function in order to reduce the averaged power of the error signal.

Depending on the type of transistor (e.g., BJT or CMOS), current mirrors CM1-CM3 can be implemented in different ways. CMOS current mirrors can be used to overcome the base current error of BJT current mirrors. Several design factors, however, may need to be considered, such as the bandwidth, linearity and charge conservation transfer function. For example, the integrated output voltage of the integration capacitor, should be approximately equal for positive and negative input pulses, and the magnitude should be proportional to the pulse-width. This may be true even when the pulse-width approaches one bit period. This does not necessarily mean that the output current pulse width has to be as short as the input pulse, just that the charge (area: Iout*t) should be proportional to the input pulse area. The linear stage with the negative feedback resistors R1 and R2 may be designed to have a more linear transfer function. The tail current (I0), should be optimized for the highest bandwidth/gain within its switching region of the differential stage.

Figure 5A:
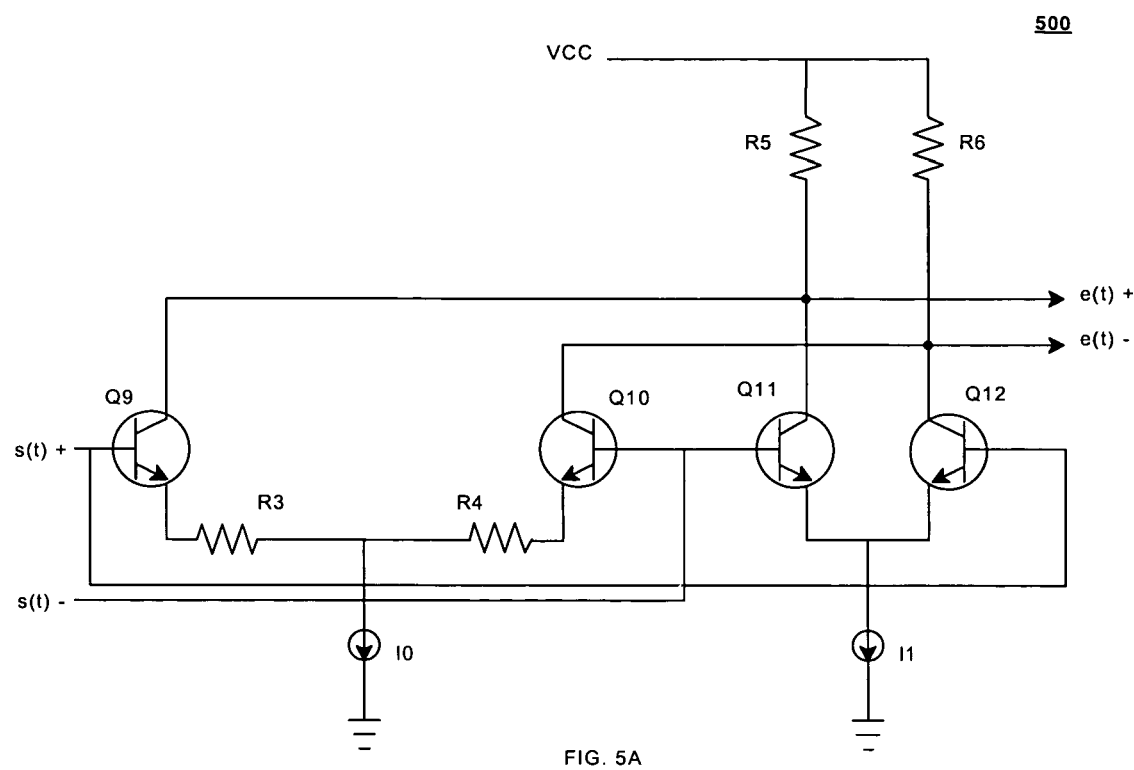
FIG. 5A illustrates a block diagram of an error signal generator (ESG) 500.

FIG. 5A illustrates a block diagram of an ESG 500. ESG 500 may be representative of, for example, ESG 308 of FFE 300 as described with reference to FIG. 3. In one embodiment, ESG 500 may receive differential input signals s(t)+ and s(t)−, and output differential error signals e(t)+ and e(t)− for FFE 300. More particularly, ESG 500 may generate an error signal e(t) at a full signal speed for use with correlator 302. The correlation of the error signal with the incoming signal may be used to cancel or equalize the deterministic part of the inter-symbol interference (ISI) embedded in the received data signal. Due to the nature of the negative feedback and correlator 302, the LMS based implementation of FFE 300 may help ensure that the incoming signal is properly reconstructed, and that the residual error is un-correlated with the data signal. In other words, FFE 300 may be arranged to ensure that there is no data information left in the residual error signal once an LMS controller has settled on a slowly varying stationary solution.

Conventional ESG techniques may attempt to compare a reconstructed analog signal with an ideal reference signal generated by use of an ideal limiting device. This technique, however, may not account for certain process limitations, such as finite bandwidth, finite gain, and slew-rate limitation. These process limitations may affect the physical circuit implementation of the limiting device. In addition, the non-zero signal propagation delay of the limiting device should ideally be compensated by a corresponding delay of a linear buffer.

In one embodiment, ESG 500 may be implemented to perform the intended subtraction to generate error signal e(t). ESG 500 may include two CML differential stages to perform the intended subtraction. Implementing ESG 500 using differential signaling and CML circuit stages may provide several advantages, some of which are due to such properties as a self-supporting threshold, superior low-noise emission, and ground bounce suppression.

In one embodiment, ESG 500 may include a linear stage comprising transistors Q9 and Q10 and negative feedback resistors R3 and R4. The base of Q9 may be connected to a first input signal s(t)+. The emitter of Q9 may be connected to negative feedback resistor R3, and the collector of Q9 may be connected to load resistor R5 and to a first output to provide error signal e(t)+. The emitter of Q10 may be connected to negative feedback resistor R4, and the collector of Q10 may be connected to load resistor R6 and a second output to provide error signal e(t)−. Negative feedback resistors R3 and R4 may be connected in series. The commonly connected negative feedback resistors may be connected to current source I0.

In one embodiment, ESG 500 may include a limiting stage comprising transistors Q11 and Q12 and load resistors R5 and R6. The base of Q11 may be connected to the base of Q10. The commonly connected bases of Q10 and Q11 may be connected to a second input signal s(t)−. The collector of Q11 may be connected to load resistor R5. The collector of Q12 may be connected to load resistor R6. Load resistors R5 and R6 may be connected to voltage supply VCC. The emitters of Q11 and Q12 may be connected. The commonly connected emitters of Q11 and Q12 may be connected to current source I1.

Depending on the transistors used to implement ESG 500 (e.g., BJT or CMOS), the input switching voltage characteristic of a differential CML stage may serve as a guide for the basic design flow. For a differential CML switching stage in the current high-speed bipolar process, approximately 120 mV at nominal operating conditions may be needed for a 99% (considered complete) switching of the total current, I1. Therefore, the input signal should have an amplitude sufficiently larger than the characteristic switching voltage to ensure a fully switching limiting stage. The characteristic switching voltage may comprise, for example, 150 mV. The tail current of I1, which is typically 1 mA, may be optimized for the highest bandwidth/gain within its switching region of the differential stage. The product of the load resistors R5 and R6 is approximately 150 ohm, and the total current I1 determines the limiting output swing.

In one embodiment, the linear stage with emitter degradation negative feedback resistors R3 and R4, may be designed to have a more linear transfer function, higher output swing, and larger compression point (e.g., 1 dB), than the limiting differential stage. It is worthy to note that the for the design of ESG 500, it is feasible that the resulting transfer function is fairly asymmetrical around the two equilibrium point. For example, the magnitude of the positive and negative peaks as well as the large-signal limiting level should be comparable in magnitude. For ESG 500 as shown in FIG. 5, tail current I0 may be set to 1.5*I1, and the emitter degradation negative feedback resistors R3 and R4 may be set to 115 ohm in order to fulfill the above design constraints.

Figure 5B:
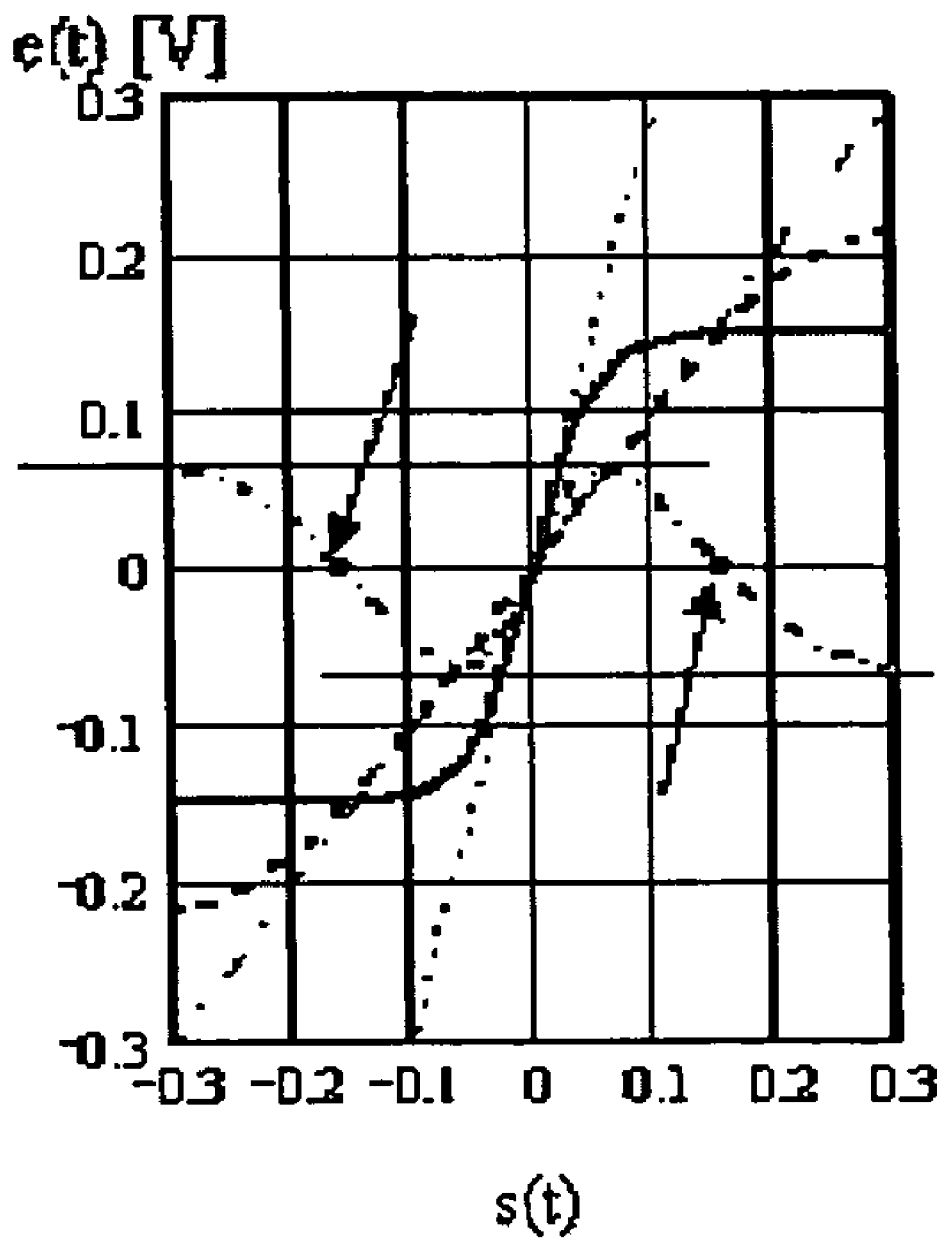
FIG. 5B illustrates a graph for a transfer function for ESG 500.

FIG. 5B illustrates a graph for a transfer function for ESG 500. A bipolar differential switching stage as represented by the solid curve may need approximately 120 mV for a 99% switching of the total current I1. Other characteristics apply to CMOS transistors, but the design methodic and considerations are typically similar to those for a BJT. Consequently, the input signal s(t) should have an amplitude larger than approximately 150 mV, for example, in order to ensure a fully switching limiting stage.

As shown in FIG. 5B, the transfer function of the linear stage is shown by the dashed curve, and the over-all transfer function of the distance (error) signal is plotted with the dash-dotted curve. When the error signal e(t) is correlated with the input signal s(t) by correlator 302, FFE 300 will settle the data signal amplitude of s(t) on two equilibrium points as marked in the plot.

Figure 6:
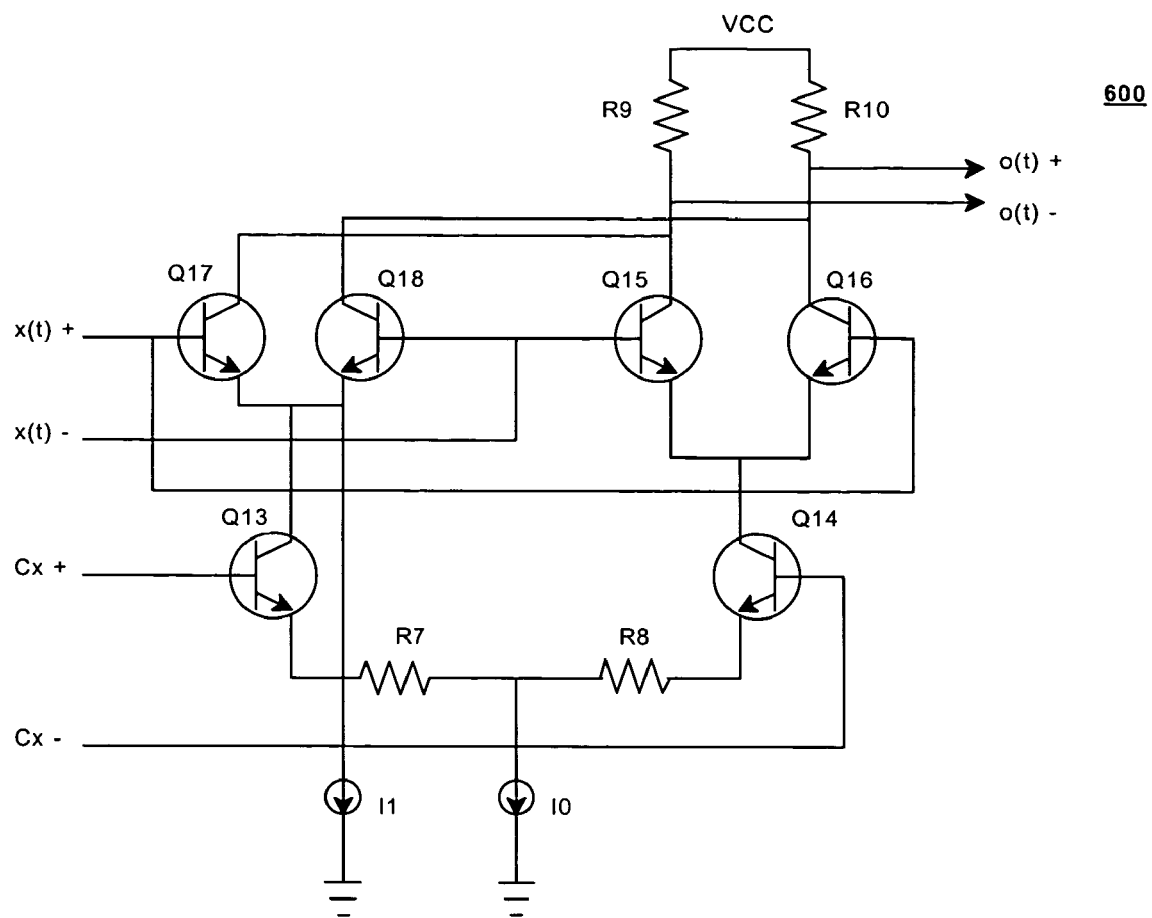
FIG. 6 illustrates a block diagram of a filter multiplier 600.

FIG. 6 illustrates a block diagram of a filter multiplier 600. Filter multiplier 600 may be representative of, for example, one or more of filter multipliers FM1-FMP of FFE 300 as described with reference to FIG. 3. During start-up and operational phases of FFE 300, the coefficients for FFE 300 or the integrator outputs of INT1-INTN+1 should be initialized or tailored within certain ranges in order to ensure convergence and potentially avoid the zero-state solution. Conventional FFE techniques may utilize additional initialization circuitry to obtain proper start-up and recovery from data signal interruptions. Filter 304, however, may be implemented using one or more filter multipliers 600 to avoid such initialization circuitry.

As previously discussed with reference to FIG. 3, the outputs of correlator 302 may be fed to their respective coefficients within filter 304. The coefficient range of filter multipliers FM1-FMP may be normalized to [−1; +1]. As a special case during the start-up phase, the LMS controller may get stocked in the zero-state solution, that is, all coefficients may be set to zero (0). This may force an undesirable zero state stationary solution. Although this solution is at an unstable operating point (e.g., labile stability), it may be the most prevalent due to other non-ideal functions and practical circuit implementations.

In one embodiment, filter multiplier 600 may solve these and other problems by modifying the coefficient range of one or more filter multipliers, such as the center-tap multiplier, for example. This may circumvent the start-up and dead-lock solutions described previously.

In one embodiment, filter multiplier 600 may include a linear stage comprising transistor Q13 and Q14, and negative feedback resistors R7 and R8. The base of Q13 may be connected to a first input signal Cx+. The emitter of Q13 may be connected to negative feedback resistor R7. The base of Q14 may be connected to a second input signal Cx−. The emitter of Q14 may be connected to negative feedback resistor R8. Negative feedback resistors R7 and R8 may be connected in series. The commonly connected negative feedback resistors R7 and R8 may be connected to current source I0.

In one embodiment, filter multiplier 600 may include transistors Q15 and Q16 and load resistors R9 and R10. The base of Q15 may be connected to the base of Q18. The collector of Q15 may be connected to load resistor R9. The base of Q16 may be connected to a third input signal x(t)+ and the base of Q17. The collector of Q16 may be connected to load resistor R10. Load resistors R9 and R10 may be connected to voltage supply VCC. The emitters of Q15 and Q16 may be connected. The commonly connected emitters of Q15 and Q16 may be connected to the collector of Q14.

In one embodiment, filter multiplier 600 may include transistors Q17 and Q18. The base for Q17 may be connected to the first input signal x(t)+. The collector of Q17 may be connected to the collector of Q16. The emitters for Q17 and Q18 may be connected. The commonly connected emitters of Q17 and Q18 may be connected to the collector of Q13, and to current source I1. The commonly connected bases of Q15 and Q18 may be connected to a fourth input signal x(t)−.

In one embodiment, the commonly connected collector of Q15 and load resistor R9 may be connected to a first output to output signal o(t)+. The commonly connected collector of Q16 and load resistor R9 may be connected to a second output to output signal o(t)−.

As shown in FIG. 6, an additional current source I1 may be added in order to offset the gain range of the center coefficient. The currents in the center-tap may be set as follows: (I0, I1)=(0.5*I0', 1.5*I0'), where I0' is the original value used in the basic multiplier design. For the other filter multiplier cells, the current I1 may be set to zero (0). This may result in a normalized gain range of [+1; +2] for the center-tap coefficient.

Figure 7:
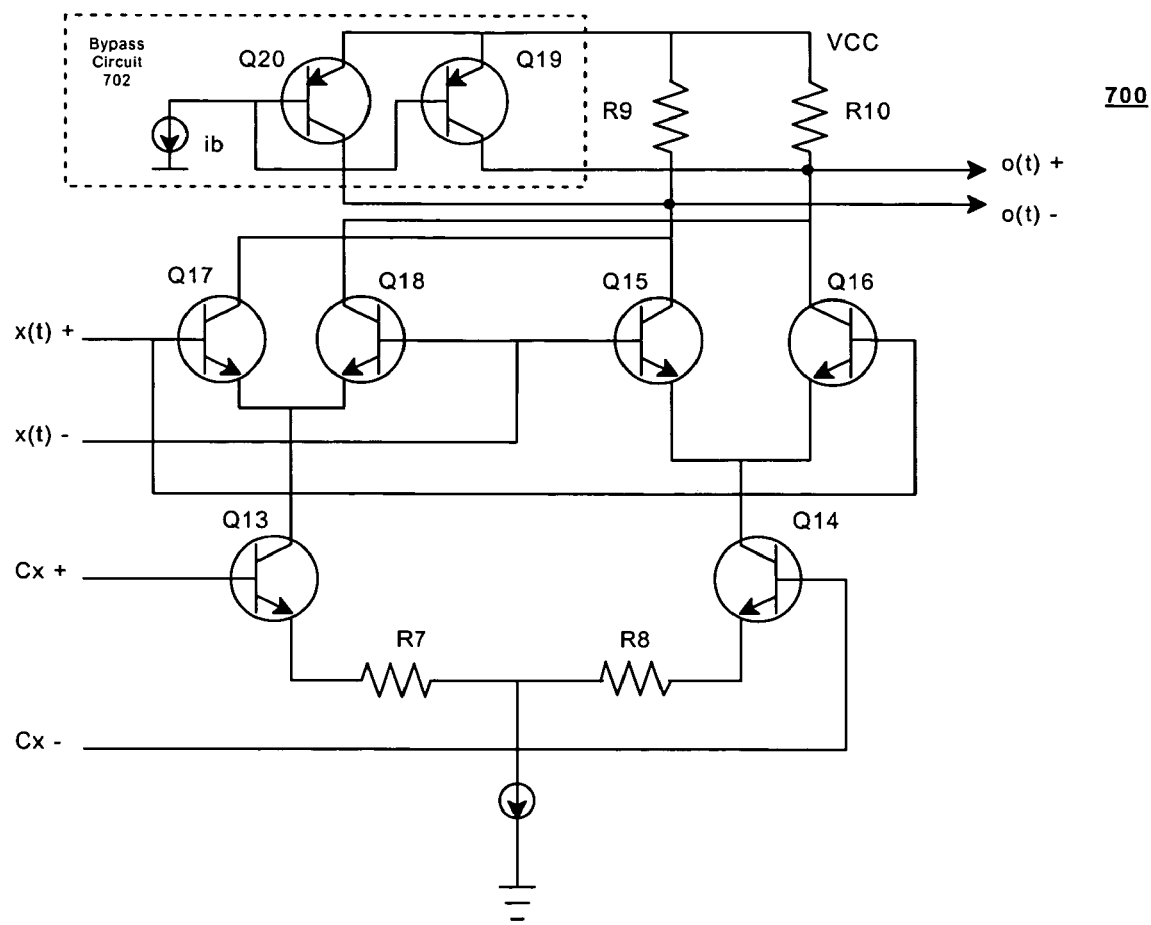
FIG. 7 illustrates a block diagram of a filter multiplier 700.

FIG. 7 illustrates a block diagram of a filter multiplier 700. Filter multiplier 700 may be representative of, for example, one or more of filter multipliers FM1-FMP of FFE 300 as described with reference to FIG. 3. For some transceivers, it may be desirable to implement an FFE using a relatively large number of filter taps or coefficients to tailor the transfer function of the FFE. This may be particularly desirable in the case where there may be a larger amount of ISI results in spreading the data information over several bit periods, which may occur in over-fill launch (OFL) conditions of multi-mode fibers (MMF), for example.

Adding taps to a FFE, however, may create a head-room problem due to the direct current (DC) of the large number of filter multiplier cells driving the common load of summation 306. As the number of tap coefficients increase, the total DC voltage drop over the load resistors may proportionally increase as well. The differential output swing, however, typically stays at the same value independent of the number of taps. This assumes a proper scaling of the coefficients combined with use of an AGC or LMS controller. At a certain number of taps, the voltage drop may grow so large that the head-room of the transistors is zero (0) and some of the transistors or current sources may turn into saturation. This may lead to distortion in high-speed analog signals. This problem may get even worse when mitigating to lower supply voltages. Consequently, conventional techniques attempt to avoid this problem by limiting the number of taps for an FFE to a relatively small number, such as approximately 5-7 coefficients.

In one embodiment, filter multiplier 700 may solve these and other problems using a DC bypass circuit. The use of a DC bypass circuit may circumvent a large voltage drop across the load resistors for filter multiplier 700.

In one embodiment, filter multiplier 700 may be similar to filter multiplier 600. For example, transistors Q13-Q18 as shown in FIG. 7 may be arranged in a similar topology as transistors Q13-Q18 as shown in FIG. 6, with the exception of eliminating current source I1. Further, filter multiplier 700 may connect the outputs o(t)+ and o(t)− to the collectors of Q19 and Q20, respectively, rather than the load resistors as in filter multiplier 600.

In one embodiment, filter multiplier 700 may further include a DC bypass circuit 702 connected with load resistors R9 and R10. DC bypass circuit 702 may include transistors Q19 and Q20. The emitter of Q19 may be connected to load resistors R9 and R10, and the collector of Q19 may be connected to load resistor R10 and a first output to output signal o(t)+. The emitter of Q20 may also be connected to load resistors R9 and R10, and the collector of Q20 may be connected to load resistor R9 and a second output to output signal o(t)−. The base of Q20 may be connected to a current source ib. The base of Q19 may be connected to the base of Q20 and current source ib.

As shown in FIG. 7, the large voltage drop caused by multiple filter taps may be reduced or circumvented by using two bypass current sources with load resistors R9 and R10. The two bypass current sources may be implemented using properly biased transistors Q19 and Q20, and utilizing the saturation voltage ($V_{CE, sat}$) to determine the common mode level at summation 306. Other common mode voltage levels can be obtained by negative feedback from the common mode output voltage to the bias control (e.g., current source ib), which determines the bias conditions such as base potential of the bypass transistors Q19 and Q20.

In one embodiment, bypass circuit 702 should result in a relatively small increase in power consumption, as represented by (VCC*ib). Bypass circuit 702, however, should give a relatively large improvement of the performance of FFE 300 by reducing or eliminating the large DC voltage drop and head-room problems. Consequently, filter multiplier 700 may result in a more power efficient implementation of a FFE with a larger number of taps. The number of taps may be increased by an expansion of the unit-cell implementation.

In one embodiment, filter multiplier 700 may be implemented using BJT or CMOS transistors. Design goals may include a filter multiplier with high output impedance relative to the load resistors and low capacitive load.

Although the terms "first, second, third" and so forth may be used herein to identify certain elements, it may be appreciated that these terms do not necessarily represent a specific element or a specific order. Rather, these terms may be used to merely differentiate one element from another element. Consequently, these terms may be used multiple times to represent a number of different elements in accordance with a given implementation.

Numerous specific details have been set forth herein to provide a thorough understanding of the embodiments. It will be understood by those skilled in the art, however, that the embodiments may be practiced without these specific details. In other instances, well-known operations, components and circuits have not been described in detail so as not to obscure the embodiments. It can be appreciated that the specific structural and functional details disclosed herein may be representative and do not necessarily limit the scope of the embodiments.

It is also worthy to note that any reference to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

Some embodiments may be implemented using an architecture that may vary in accordance with any number of factors, such as desired computational rate, power levels, heat tolerances, input data rates, output data rates, and other performance constraints. For example, an embodiment may be implemented as dedicated hardware, such as a circuit, an application specific integrated circuit (ASIC), Programmable Logic Device (PLD) or digital signal processor (DSP), and so forth. In yet another example, an embodiment may be implemented by a combination of programmed general-purpose computer components and custom hardware components. The embodiments are not limited in this context.

Some embodiments may be described using the expression "coupled" and "connected" along with their derivatives. It should be understood that these terms are not intended as synonyms for each other. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

While certain features of the embodiments have been illustrated as described herein, many modifications, substitutions, changes and equivalents will now occur to those skilled in the art. It is therefore to be understood that the appended claims are intended to cover all such modifications and changes as fall within the true spirit of the embodiments.

The invention claimed is:

1. An equalizer, comprising:
a tapped filter having multiple filter multipliers and a summing element;
a correlator having multiple correlator multipliers, with each correlator multiplier having a corresponding integrator;
a set of shared delay elements to connect to said filter multipliers and said correlator multipliers, with each delay element to include multiple delay stages, with a first delay stage to receive an input data signal and output a first delay signal to one of said correlator multipliers and none of said filter multipliers, and a second delay stage to receive said first delay signal and output a second delay signal to one of said filter multipliers and none of said correlator multipliers; and
an error signal generator to connect to said correlator, said error signal generator comprising a slicer and a subtraction node, said slicer to receive as input a linear input signal from said summing element and output a sliced signal, the subtraction node to subtract said sliced signal from said linear input signal to form an error signal for output to said correlator.

2. The equalizer of claim 1, wherein said linear stage comprises a differential current-mode logic stage, said linear stage having a linear transfer function in order to reduce the average power of an error signal.

3. The equalizer of claim 1, wherein said linear stage includes a first transistor and a second transistor, said first transistor to have a base to connect to a first input and an emitter to connect to a first negative feedback resistor, and said second transistor to have a base to connect to a second input and an emitter to connect to a second negative feedback resistor, said first and second negative feedback resistors connected in series, and said commonly connected first and second negative feedback resistors to connect to a current source.

4. The equalizer of claim 1, wherein said error signal generator comprises:
a linear stage; and
a limiting differential stage to connect to said linear stage.

5. The equalizer of claim 4, wherein said linear stage includes a first transistor and a second transistor, said first transistor to have a base to connect to a first input and an emitter to connect to a first negative feedback resistor and a collector to a first output, and said second transistor to have a base to connect to a second input and an emitter to connect to a second negative feedback resistor and a collector to connect to a second output, said first and second negative feedback resistors connected in series, and said commonly connected first and second negative feedback resistors to connect to a first current source.

6. The equalizer of claim 5, wherein said limiting differential stage to include a third transistor and a fourth transistor, said third transistor to have a base to connect to said base of said second transistor and a collector to connect to a first load resistor, said fourth transistor to have a base to connect to said first input and a collector to connect to a second load resistor, said third and fourth transistors having commonly connected emitters to connect to a second current source, and said first and second load resistors to connect to a voltage source.

7. The equalizer of claim 1, wherein one of said filter multipliers is a filter multiplier for a center-tap coefficient, said filter multiplier for said center-tap coefficient to include a current source to offset a gain range of said center-tap coefficient.

8. The equalizer of claim 1, wherein one of said filter multipliers is a filter multiplier for a center-tap coefficient, said filter multiplier for said center-tap coefficient to include a linear stage, said linear stage to include a first transistor and a second transistor, said first transistor to have a base to connect to a first input and an emitter to connect to a first negative feedback resistor, and said second transistor to have a base to connect to a second input and an emitter to connect to a second negative feedback resistor, said first and second negative feedback resistors connected in series, and said commonly connected first and second negative feedback resistors to connect to a first current source.

9. The equalizer of claim 8, further comprising a third transistor and a fourth transistor, said third transistor to have a collector to connect to a first load resistor, said fourth transistor to have a base to connect to a third input and a collector to connect to a second load resistor, said third and fourth transistors having commonly connected emitters to connect to a collector for said second transistor, and said first and second load resistors to connect to a voltage source.

10. The equalizer of claim 9, further comprising a fifth transistor and a sixth transistor, said fifth transistor to have a base to connect to said third input and a collector to connect to said collector for said third transistor, said sixth transistor to have a base to connect to a base for said third transistor and an emitter to connect to a second current source and a collector to connect to a collector for said fourth transistor, said fifth and sixth transistors to have commonly connected emitters to connect to a collector for said first transistor, and said commonly connected bases of said third transistor and said sixth transistor to connect to a fourth input.

11. The equalizer of claim 10, wherein said commonly connected first load resistor and emitter for said third transistor is connected to a first output, and said commonly connected second load resistor and emitter for said fourth transistor is connected to a second output.

12. The equalizer of claim 1, wherein at least one of said filter multipliers includes a linear stage, said linear stage to include a first transistor and a second transistor, said first transistor to have a base to connect to a first input and an emitter to connect to a first negative feedback resistor, and said second transistor to have a base to connect to a second input and an emitter to connect to a second negative feedback resistor, said first and second negative feedback resistors connected in series, and said commonly connected first and second negative feedback resistors to connect to a first current source.

13. The equalizer of claim 12, further comprising a third transistor and a fourth transistor, said third transistor to have a collector to connect to a first load resistor, said fourth transistor to have a base to connect to a third input and a collector to connect to a second load resistor, said third and fourth transistors having commonly connected emitters to connect to a collector for said second transistor.

14. The equalizer of claim 13, further comprising a fifth transistor and a sixth transistor, said fifth transistor to have a base to connect to said third input and a collector to connect to said collector for said third transistor, said sixth transistor to have a base to connect to a base for said third transistor and a collector to connect to a collector for said fourth transistor, said fifth and sixth transistors to have commonly connected emitters to connect to a collector for said first transistor, and said commonly connected bases of said third transistor and said sixth transistor to connect to a fourth input.

15. The equalizer of claim 14, wherein said at least one filter multiplier further comprises a direct current bypass circuit, said direct current bypass circuit to include a seventh transistor and an eighth transistor, said seventh transistor to have an emitter to connect to said first and second load resistors and a collector to connect to a first output, said eighth transistor to have an emitter to connect to said first and second load resistors and a collector to connect to a second output, said eighth transistor to have a base to connect to a second current source, and said seventh transistor to have a base to connect to said base of said eighth transistor and said second current source.

16. A system, comprising:
a communications medium;
a transceiver to connect to said communications medium, said transceiver to include a feed-forward equalizer to receive an input data signal and output an equalized signal, said feed-forward equalizer to comprise:
a tapped filter having multiple filter multipliers and a summing element;
a correlator having multiple correlator multipliers, with each correlator multiplier having a corresponding integrator;
a set of shared delay elements to connect to said filter multipliers and said correlator multipliers, with each delay element to include multiple delay stages, with a first delay stage to receive an input data signal and output a first delay signal to one of said correlator multipliers and none of said filter multipliers, and a second delay stage to receive said first delay signal and output a second delay signal to one of said filter multipliers and none of said correlator multipliers; and
an error signal generator to connect to said correlator, said error signal generator comprising a slicer and a subtraction node, said slicer to receive as input a linear input signal from said summing element and output a sliced signal, the subtraction node to subtract said sliced signal from said linear input signal to form an error signal for output to said correlator.

17. The system of claim 16, wherein said linear stage comprises a differential current-mode logic stage, said linear stage having a linear transfer function in order to reduce the average power of an error signal.

18. The system of claim 16, wherein said linear stage includes a first transistor and a second transistor, said first transistor to have a base to connect to a first input and an emitter to connect to a first negative feedback resistor, and said second transistor to have a base to connect to a second input and an emitter to connect to a second negative feedback resistor, said first and second negative feedback resistors connected in series, and said commonly connected first and second negative feedback resistors to connect to a current source.

19. The system of claim 16, wherein said error signal generator comprises:

a linear stage; and
a limiting differential stage to connect to said linear stage.

20. The system of claim 19, wherein said linear stage includes a first transistor and a second transistor, said first transistor to have a base to connect to a first input and an emitter to connect to a first negative feedback resistor and a collector to a first output, and said second transistor to have a base to connect to a second input and an emitter to connect to a second negative feedback resistor and a collector to connect to a second output, said first and second negative feedback resistors connected in series, and said commonly connected first and second negative feedback resistors to connect to a first current source.

21. The system of claim 20, wherein said limiting differential stage to include a third transistor and a fourth transistor, said third transistor to have a base to connect to said base of said second transistor and a collector to connect to a first load resistor, said fourth transistor to have a base to connect to said first input and a collector to connect to a second load resistor, said third and fourth transistors having commonly connected emitters to connect to a second current source, and said first and second load resistors to connect to a voltage source.

22. The system of claim 16, wherein one of said filter multipliers is a filter multiplier for a center-tap coefficient, said filter multiplier for said center-tap coefficient to include a current source to offset a gain range of said center-tap coefficient.

23. The system of claim 16, wherein one of said filer multipliers is a filter multiplier for a center-tap coefficient, said filter multiplier for said center-tap coefficient to include a linear stage, said linear stage to include a first transistor and a second transistor, said first transistor to have a base to connect to a first input and an emitter to connect to a first negative feedback resistor, and said second transistor to have a base to connect to a second input and an emitter to connect to a second negative feedback resistor, said first and second negative feedback resistors connected in series, and said commonly connected first and second negative feedback resistors to connect to a first current source.

24. The system of claim 23, further comprising a third transistor and a fourth transistor, said third transistor to have a collector to connect to a first load resistor, said fourth transistor to have a base to connect to a third input and a collector to connect to a second load resistor, said third and fourth transistors having commonly connected emitters to connect to a collector for said second transistor, and said first and second load resistors to connect to a voltage source.

25. The system of claim 24, further comprising a fifth transistor and a sixth transistor, said fifth transistor to have a base to connect to said third input and a collector to connect to said collector for said third transistor, said sixth transistor to have a base to connect to a base for said third transistor and an emitter to connect to a second current source and a collector to connect to a collector for said fourth transistor, said fifth and sixth transistors to have commonly connected emitters to connect to a collector for said first transistor, and said commonly connected bases of said third transistor and said sixth transistor to connect to a fourth input.

26. The system of claim 25, wherein said commonly connected first load resistor and emitter for said third transistor is connected to a first output, and said commonly connected second load resistor and emitter for said fourth transistor is connected to a second output.

27. The system of claim 16, wherein at least one of said filter multipliers includes a linear stage, said linear stage to include a first transistor and a second transistor, said first transistor to have a base to connect to a first input and an emitter to connect to a first negative feedback resistor, and said second transistor to have a base to connect to a second input and an emitter to connect to a second negative feedback resistor, said first and second negative feedback resistors connected in series, and said commonly connected first and second negative feedback resistors to connect to a first current source.

28. The system of claim 27, further comprising a third transistor and a fourth transistor, said third transistor to have a collector to connect to a first load resistor, said fourth transistor to have a base to connect to a third input and a collector to connect to a second load resistor, said third and fourth transistors having commonly connected emitters to connect to a collector for said second transistor.

29. The system of claim 28, further comprising a fifth transistor and a sixth transistor, said fifth transistor to have a base to connect to said third input and a collector to connect to said collector for said third transistor, said sixth transistor to have a base to connect to a base for said third transistor and a collector to connect to a collector for said fourth transistor, said fifth and sixth transistors to have commonly connected emitters to connect to a collector for said first transistor, and said commonly connected bases of said third transistor and said sixth transistor to connect to a fourth input.

30. The system of claim 29, wherein said at least one filter multiplier further comprises a direct current bypass circuit, said direct current bypass circuit to include a seventh transistor and an eighth transistor, said seventh transistor to have an emitter to connect to said first and second load resistors and a collector to connect to a first output, said eighth transistor to have an emitter to connect to said first and second load resistors and a collector to connect to a second output, said eighth transistor to have a base to connect to a second current source, and said seventh transistor to have a base to connect to said base of said eighth transistor and said second current source.

31. A feed forward equalizer, comprising:
a filter having multiple filter multipliers and a summing element;
a correlator having multiple correlator multipliers, with each correlator multiplier having a corresponding integrator, each integrator comprises a linear stage and a set of three current mirrors to connect to said linear stage;
a set of shared delay elements to connect to said filter multipliers and said correlator multipliers, with each delay element to include multiple delay stages, with a first delay stage to receive an input data signal and output a first delay signal to only one of said correlator multipliers and a second delay stage, and a second delay stage to receive said first delay signal and output a second delay signal to only one of said filter multipliers and another delay element; and
an error signal generator to connect to said correlator, said error signal generator comprising a slicer and a subtraction node, said slicer to receive as input a linear input signal from said summing element and output a sliced signal, the subtraction node to subtract said sliced signal from said linear input signal to form an error signal for output to said correlator.

32. The feed forward equalizer of claim 31, wherein said linear stage comprises a differential current-mode logic stage, said linear stage having a linear transfer function in order to reduce the average power of an error signal.

33. The feed forward equalizer of claim 31, wherein one of said filter multipliers is a filter multiplier for a center-tap coefficient, said filter multiplier for said center-tap coefficient to include a current source to offset a gain range of said center-tap coefficient.

34. The feed forward equalizer of claim 31, wherein at least one of said filter multipliers includes a linear stage, said linear stage to include a first transistor and a second transistor, said first transistor to have a base to connect to a first input and an emitter to connect to a first negative feedback resistor, and said second transistor to have a base to connect to a second input and an emitter to connect to a second negative feedback resistor, said first and second negative feedback resistors connected in series, and said commonly connected first and second negative feedback resistors to connect to a first current source.

35. The feed forward equalizer of claim 34, further comprising a third transistor and a fourth transistor, said third transistor to have a collector to connect to a first load resistor, said fourth transistor to have a base to connect to a third input and a collector to connect to a second load resistor, said third and fourth transistors having commonly connected emitters to connect to a collector for said second transistor.

36. The feed forward equalizer of claim 35, further comprising a fifth transistor and a sixth transistor, said fifth transistor to have a base to connect to said third input and a collector to connect to said collector for said third transistor, said sixth transistor to have a base to connect to a base for said third transistor and a collector to connect to a collector for said fourth transistor, said fifth and sixth transistors to have commonly connected emitters to connect to a collector for said first transistor, and said commonly connected bases of said third transistor and said sixth transistor to connect to a fourth input.

37. The equalizer of claim 36, wherein said at least one filter multiplier further comprises a direct current bypass circuit, said direct current bypass circuit to include a seventh transistor and an eighth transistor, said seventh transistor to have an emitter to connect to said first and second load resistors and a collector to connect to a first output, said eighth transistor to have an emitter to connect to said first and second load resistors and a collector to connect to a second output, said eighth transistor to have a base to connect to a second current source, and said seventh transistor to have a base to connect to said base of said eighth transistor and said second current source.

\* \* \* \* \*